United States Patent [19]

Mallick, Jr. et al.

[11] Patent Number: 4,978,922

[45] Date of Patent: Dec. 18, 1990

[54] SUPERCONDUCTING SENSOR FOR QUENCH DETECTION IN A SUPERCONDUCTOR

[75] Inventors: George T. Mallick, Jr., Monroeville; James R. Logan, Hampton Township, Allegheny County; Phillip W. Eckels, Penn Hills Township, Allegheny County, all of Pa.

[73] Assignee: Westinghouse Electric Corp., Pittsburgh, Pa.

[21] Appl. No.: 401,592

[22] Filed: Aug. 31, 1989

[51] Int. Cl.$^5$ .................... G01K 17/00; G01R 27/00
[52] U.S. Cl. .................... 324/652; 505/843; 505/1; 361/19
[58] Field of Search ............. 324/57 Q, 633, 203, 324/204, 248, 71.6, 655, 652, 708; 336/DIG. 1; 374/176; 505/843, 847

[56] References Cited

U.S. PATENT DOCUMENTS

| 2,926,343 | 2/1960 | Postal | 374/176 |
| 3,214,637 | 10/1965 | Persson | 361/19 |
| 3,579,035 | 5/1971 | Burnier | 361/19 |
| 4,777,437 | 10/1988 | Tashiro et al. | 324/248 |

FOREIGN PATENT DOCUMENTS 607374 1/1985 Japan .................... 324/248

OTHER PUBLICATIONS

"Proceedings of 17th International Conference on Low Temp. Physics", 1984, pp. 407-408, Moody et al.

Primary Examiner—Reinhard J. Eisenzopf
Assistant Examiner—Maura K. Regan

[57] ABSTRACT

The present invention provides a straightforward sensor and method for quench detection in a superconducting coil, magnet or inductor. The superconducting sensor of the present invention consists of a probe having a twisted loop of superconducting wire in a protective sheath which is co-wound with the superconducting coil, and a readout device. A very small amount of energy is applied to the superconducting loop of wire in the probe by the readout device and its resistance is monitored by readout device. When joule heating occurs in the superconducting coil as a result of a portion becoming normal, the heat is transferred to a corresponding portion of the probe causing a portion of the superconducting wires therein to become normal. This causes the resistance in the superconducting wires to change and this change is detected or measured by the readout device which is magnetically coupled to the wires of the probe.

8 Claims, 1 Drawing Sheet

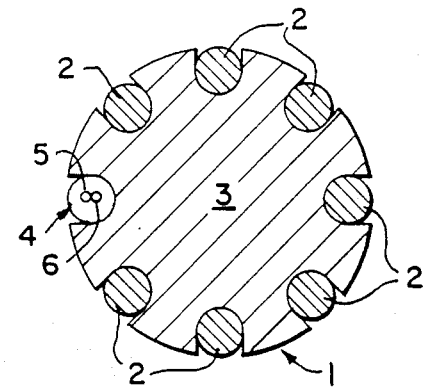
Figure 1
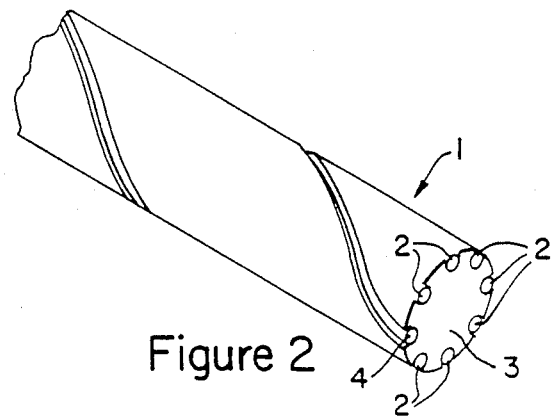
Figure 2
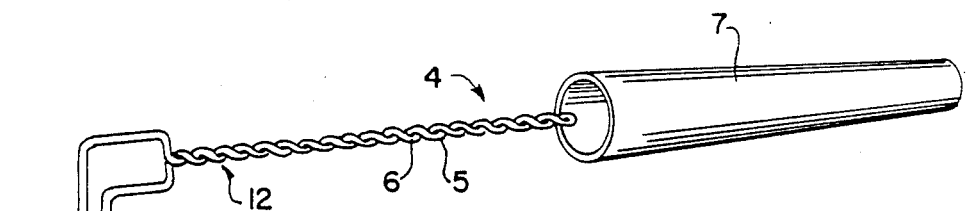
Figure 3
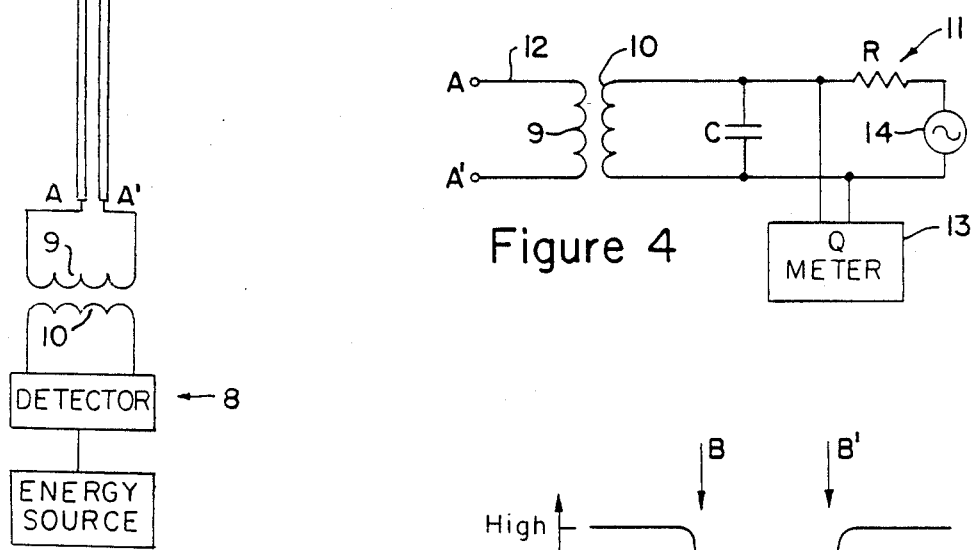
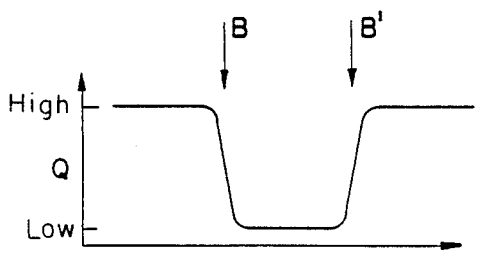
Figure 4
Figure 5

SUPERCONDUCTING SENSOR FOR QUENCH DETECTION IN A SUPERCONDUCTOR

FIELD OF THE INVENTION

The present invention relates to a sensor and method for using the same to detect the occurrence of a resistive zone or quench in a superconductor and more particularly to a quench detection sensor utilizing a superconducting sensor.

BACKGROUND OF THE INVENTION

Superconducting magnets and inductors are capable of generating high magnetic fields and thereby storing large amounts of energy. Superconducting inductors are very efficient for these purposes because no energy is lost to resistive or joule heating in the superconducting current path. Every superconducting material has a critical temperature $T_c$ for a given ambient magnetic field above which the material is no longer superconducting. If a region of a superconducting material loses its superconducting property (i.e. becomes normal or quenches), joule heating occurs in the normal or resistive, nonsuperconducting region. If the region is small enough or the cooling sufficient enough, the heat will be dissipated and the region will return to its superconducting state.

If the region is large, such that sufficient joule heating occurs and overcomes the system's ability to dissipate the heat, the normal zone will propagate and grow larger, causing a catastrophic condition which can result in severe damage to the inductor or magnet as even more energy is dissipated in portions of the inductor or magnet. This runaway condition can result in the uncontrolled dumping of the entire magnetic energy of the inductor or magnet into a localized region, thus causing damage to itself and possibly to the load. It could also result in a service outage of the inductor or magnet which could be intolerable if the inductor or magnet where part of a device having a critical military application. Early detection of a quench, however, permits the energy stored in the magnet or inductor to be dissipated in a controlled fashion. The energy can be dissipated in a variety of ways such as through dump resistors or by making the entire magnet or inductor go normal in a controlled fashion. Catastrophic damage due to overheating is thereby avoided.

Generally, a superconducting inductor is any current path composed of a superconducting material since any current path has a self-inductance. Superconducting inductors, and especially superconducting energy storage inductors, are generally configured as coils called solenoids or toroids. Superconducting magnets, which are a special case of superconducting inductors, often have more complex shapes, so as to appropriately shape the magnetic field they produce.

Several techniques exist for detecting and locating normal regions in a superconducting magnet or inductor. The principle technique has been the use of a series of voltage taps. Voltages are measured by voltmeters at various points along the coil of the superconducting material, with the objective of correlating changes in voltage with the change in resistivity due to the creation of a normal region. A severe drawback with using voltage taps is that in addition to the resistive voltage associated with a normal zone, a superconducting inductor produces inductive voltages resulting from the charging and discharging of the coil. These "common mode" inductive voltages are variable and change with any changes in the magnetic field. Also, since normal zones must be detected when they are small, the resistive voltage drop resulting from a quench is very small, typically 1.0–2.0 volts; whereas the common mode inductive voltage between two voltage taps is typically much larger and can be tens of kilovolts. If voltage taps are used, some technique must be utilized to eliminate the inductive voltage from the voltage measured at the taps. Typically, this involves subtracting out the inductive voltage by comparing the signal to a reference voltage. In any event, the technique involves subtracting two voltage measurements, one entirely inductive and the other mostly inductive but also having a small resistive component, with the goal of recovering the small resistive component.

As mentioned above, the inductive voltage across the inductor's terminals may be tens of kilovolts during normal operation. This means that an effective sensor must be capable of being operated effectively at these high common mode voltages. This places a severe constraint upon any electronic components in the sensor attached to the voltage taps to measure and detect a quench since these components must be designed to operate at these high inductive voltages. Also, since the components may be placed close to the voltage taps, they must operate in high magnetic fields, and preferably at cryogenic temperatures.

It would be desirable, therefore to develop an alternative sensor and method for using the same to easily detect a quench in a superconductor under operating and quiescent conditions without encountering the difficulties mentioned above, which are associated with voltage taps.

SUMMARY OF THE INVENTION

Generally, the present invention relates to a superconducting sensor and method for using the same to detect a quench in a superconductor, typically a superconducting coil, inductor or magnet. The probe portion of the sensor utilizes two long twisted wires of superconducting material, preferably co-wound with the superconducting coil as a temperature sensor. Preferably the probe wires are made from a similar superconducting material as the superconducting coil itself so that they both have a similar transition temperature $T_c$. The probe is placed alongside and in intimate thermal contact with the superconducting coil to enable heat transfer easily to occur, keeping the sensor and coil at the same or similar temperatures.

The first ends of the two long strands of wire are shorted together to form a loop which is then twisted many times. The self-inductance of this twisted loop is very low as is well known since there is very little net area to interact with the magnetic field. The probe wires at the second end are connected to a readout device which detects the appearance of resistivity in the probe. Since both the coil and the probe wires are superconductors, the appearance of a normal zone in the superconducting coil will cause the corresponding section of the probe wires to go normal through heat conduction. When the resistive voltage in the probe wires of the sensor changes, this change can be detected and displayed by the readout device.

The probe is magnetically coupled to a readout device. The readout device also comprises an energy source and a device for measuring or monitoring the transfer or loss of energy. When the probe wires are superconducting, the readout device should detect almost no energy loss from the energy source. When a portion of the probe wires go normal, there should be a detectable energy loss or transfer from the energy source to the probe wires which the readout device can detect.

In one embodiment of the readout device, the second end of the probe wires are connected to a sensor coil which is magnetically coupled to a readout coil. The sensor coil and the probe wires form a probe circuit. The readout coil can be part of a readout circuit which, for example, can be a resonant or tank circuit. The Q (quality factor) of the readout tank circuit will be directly affected by the Q of the probe circuit. When the superconducting material makes a transition to the normal state, the Q of the sensor circuit will fall dramatically. This change will be coupled through the readout coil to the readout circuit. Thus by monitoring the Q of the readout circuit, a quench in the superconducting coil can be detected.

Other details, objects and advantages of the present invention will become more readily apparent from the following description of a presently preferred embodiment thereof.

BRIEF DESCRIPTION OF THE DRAWING

In the accompanying drawing, a preferred embodiment of the present, invention is illustrated, by way of example only, wherein:

FIG. 1 shows an end view of a coil of a superconducting inductor or magnet;

FIG. 2 shows a portion of the coil of FIG. 1 with only the sensor shown;

FIG. 3 shows a close-up view of the superconducting sensor;

FIG. 4 shows one embodiment of the readout device shown in FIG. 3; and

FIG. 5 shows the output of the Q-meter shown in FIG. 4.

DESCRIPTION OF THE PREFERRED EMBODIMENT

The present invention provides a straightforward and simple sensor and method for detecting a quench in a superconducting coil, inductor, or magnet. The method of detection is indirect, inasmuch as it is the localized heating associated with the quench that is detected, rather than the voltage developed across the quench itself. The present sensor and method of detection will certainly prove useful as a detection system by itself or used in conjunction with other systems.

FIG. 1 shows a cross section of a typical conductor array 1 of a superconducting coil such as is used in a magnet or inductor. The bundles of superconducting wire 2 are embedded in a supporting material 3. Typically the supporting material is shaped like a rod and has grooves cut in it to receive the superconducting wires 2. Preferably, the supporting material is aluminum due to its good thermal and electrical conductivity, however other materials with good strength and thermal conductivity can be used. When the superconducting wires 2 become normal, they have a finite resistivity and energy will be dissipated therein if the current density is not zero. This energy dissipation is reflected as a temperature rise in the supporting material 3. Some current typically is shunted into the supporting material 3 which also has a finite resistivity and, therefore, also dissipates energy.

Embedded within this aluminum supporting material 3 is a probe 4 which will respond to and track the temperature of the conductor array 1. The probe consists of two long strands of wire 5 and 6 placed in a protective sheath 7. The probe wires 5 and 6 should be electrically insulated from the protective sheath but in good thermal contact therewith. This can be accomplished by placing a dielectric material, made of MgO or BeO powders, around the wires 5 and 6. The wires 5 and 6 preferably are made of a superconducting material which has a transition temperature $T_c$ equal to the transition temperature of the superconducting wires 2 or at least in the same range. When the temperature of the conductor array 1 rises to the transition temperature of the probe wires due to the occurrence of a normal zone in the superconducting wires 2, the transition of a portion of the probe wires to a normal conductor can be detected by the readout device 8 which is magnetically coupled thereto.

The probe 4 is deployed along the length of the conductor array 1 as shown in FIG. 2. The precise path is certainly not critical. The sensor of the present invention can be constructed as shown in FIG. 3. Preferably, it consists of two long twisted strands of wire 5 and 6 of length $L_1$, which are shorted together (a superconducting short) at one end. Preferably the probe 4 containing the wires 5 and 6 is imbedded in conductor array 1 of length $L_1$. The strands of wire 5 and 6 are twisted together so that they form a two terminal device having a normal resistance $R_s$ when it is slightly above the transition temperature $T_c$. Typically, the resistance $R_s$ of the probe wires will be on the order of three or four ohms per foot. Below the transition temperature $T_c$, the DC resistance of the probe wires is zero. The inductance of the probe wires is very low due to their being twisted, since there is very little net area which interacts with the high magnetic field produced by the superconducting coil.

The two terminals A and A' of the probe wires 5 and 6 are connected to a readout device 8. The readout device 8 detects the change in resistance from zero to $R_s$ which indicates the occurrence of a normal zone in the superconducting coil. In one embodiment, as shown in FIG. 4, readout device 8 comprises a sensor coil 9 of superconducting wire, connected to terminals A and A' and having a cross-sectional area A and an inductance L. These values are certainly not critical, although it is likely that a value of L on the order of 10–100 microhenries would be practical. The sensor coil 9 is magnetically coupled to a readout coil 10 which may be, but is not necessarily, made of superconducting wire. It will be realized that since no direct electrical connection is made between the readout coil and the probe wires, any common mode voltage which is present on the conductor array 1 does not present a problem for the readout device 8 due to the magnetic coupling.

The readout coil 10 preferably comprises a part of a resonant or tank circuit 11. The Q of this tank circuit 11 is designed to be high by properly choosing the values of R, L and C. By virtue of the magnetic coupling between the readout coil 10 and the sensor coil 9, the Q of the tank circuit 11 will be directly affected by the Q of the probe circuit 12. When the probe circuit 12 is superconducting, it's Q will be very high, being essentially determined by eddy current losses in the protective sheath 7 which houses the superconducting wires 5 and 6. However, when a quench occurs and the wires 5 and 6 have a resistance $R_s$, the Q of the probe circuit 12 will fall precipitously. This change will be magnetically coupled to the tank circuit as shown in FIG. 4 and will cause the Q in the tank circuit to fall precipitously as shown in FIG. 5 at B. This change in Q of the tank circuit can be monitored by a Q-meter 13. Preferably the power for the tank circuit comes from a current limited voltage source 14.

While the readout device 8 has been shown in FIG. 4 as being a tank circuit 11 magnetically coupled to probe circuit 12, it is very evident to one skilled in the art that other magnetically coupled measuring schemes could be used in place of tank circuit 11 such as a marginal oscillator. Preferably, the magnetic coupling between coils 9 and 10 will always be used because it eliminates the problems of common mode voltages.

While a presently preferred embodiment of practicing the invention has been shown and described with particularity in connection with the accompanying drawings, the invention may otherwise be embodied within the scope of the following claims.

What is claimed is:

1. A quench detection sensor comprising a probe and a readout device, the probe capable of being placed in thermal contact with a turn of a superconducting coil and comprising a protective sheath surrounding two long twisted, insulated superconducting wires which are shorted at one end and form a sensor coil at the other end such that the sensor coil is magnetically coupled to a readout coil, the readout device comprising an energy source, the readout coil for magnetically providing energy to the probe and a detector for detecting a change in the amount of energy provided to the probe.

2. The quench detection sensor as described in claim 1 wherein the transition temperature of the twisted superconducting wires in the probe is similar to the transition temperature of the adjacent turn of the superconducting coil.

3. The quench detection sensor as described in claim 1 wherein the twisted superconducting wires are made from the same material as the turn of the superconducting coil.

4. The quench detection sensor as described in claim 1 wherein the sensor coil and the twisted superconducting wires form a probe circuit and the readout coil, the energy source and the detector comprise a readout circuit.

5. THe quench detection sensor as described in claim 4 wherein the readout circuit further comprises a tank circuit, the energy source is a power supply and the detector is a Q-meter.

6. The quench detection sensor as described in claim 5 wherein the values of the tank circuit are chosen such that the Q of the tank circuit decreases when a normal zone occurs.

7. The quench detection sensor as described in claim 1 wherein the twisted superconducting wires are electrically insulated from the sheath by a high thermal conductivity dielectric.

8. The quench detection sensor as described in claim 7, wherein the dielectric is made from MgO or BeO powder.

* * * * *